(12) United States Patent
Dove et al.

(10) Patent No.: US 6,457,979 B1
(45) Date of Patent: Oct. 1, 2002

(54) SHIELDED ATTACHMENT OF COAXIAL RF CONNECTOR TO THICK FILM INTEGRALLY SHIELDED TRANSMISSION LINE ON A SUBSTRATE

(75) Inventors: Lewis R Dove, Monument, CO (US); Marvin G Wong, Woodland Park, CO (US); John F Casey, Colorado Springs, CO (US); Wesley C Whiteley, Santa Rosa, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/016,285

(22) Filed: Oct. 29, 2001

(51) Int. Cl.⁷ ............................................. H01R 12/00
(52) U.S. Cl. ...................................................... 439/63
(58) Field of Search ........................... 439/63, 578, 581

(56) References Cited

U.S. PATENT DOCUMENTS

| | | | | |
|---|---|---|---|---|
| 3,539,966 A | * | 11/1970 | Logan ......................... | 439/578 |
| 4,737,111 A | * | 4/1988 | Minar et al. .................. | 439/63 |
| 5,044,963 A | * | 9/1991 | Kukkonen et al. ........... | 333/260 |
| 5,404,117 A | * | 4/1995 | Walz ........................... | 333/260 |
| 5,532,659 A | * | 7/1996 | Dodart ......................... | 333/260 |
| 5,738,529 A | * | 4/1998 | Wedell et al. ................ | 343/906 |
| 6,007,347 A | * | 12/1999 | Keldsen et al. .............. | 439/581 |
| 6,030,231 A | * | 2/2000 | Sarkiniemi ................... | 439/101 |
| 6,106,304 A | * | 8/2000 | Huang .......................... | 439/581 |
| 6,123,550 A | * | 9/2000 | Burkert et al. ............... | 439/581 |
| 6,358,062 B1 | * | 3/2002 | Feldman et al. ............. | 439/579 |

* cited by examiner

Primary Examiner—Tulsidas Patel
(74) Attorney, Agent, or Firm—Edward L. Miller

(57) ABSTRACT

A solution to the problem of connecting a merchant straight through coaxial RF connector to an quasi-coaxial transmission line formed on the substrate of a hybrid is to, if necessary, gradually increase the height of the center conductor of the quasi-coaxial transmission line by increasing the thickness of underlying deposited dielectric until the center conductor of the transmission line matches the position of the center conductor of the connector, which two may then be joined with solder or conductive adhesive. One style of coaxial RF connector of interest has four prongs disposed in a rectangle around the center conductor on the permanent and non-threaded side. Two of the prongs define a long side of a rectangle and may be soldered or otherwise attached to the substrate with conductive adhesive, and the two prongs that define the long side closest to the center conductor can support a small cover that physically bridges and electrically shields the gap between the connector and the end of the quasi-coaxial transmission line. The cover provides complete shielding and assists in minimizing the discontinuity in characteristic impedance caused by the transition between the connector and the quasi-coaxial transmission line.

4 Claims, 4 Drawing Sheets

A CONVENTIONAL MERCHANT
COAXIAL RF CONNECTOR

SHIELDED ATTACHMENT OF COAXIAL RF CONNECTOR TO THICK FILM INTEGRALLY SHIELDED TRANSMISSION LINE ON A SUBSTRATE

REFERENCE TO RELATED PATENTS

U.S. Pat. No. 6,255,730 B1 (to Dove, Casey and Blume, issued Jul. 3 2001) describes various thick film techniques that become possible with the recent advent of certain dielectric materials. These are KQ-120 and KQ-CL907406, which are products of Heraeus Cermalloy, 24 Union Hill Road, West Conshohocken, Pa. Hereinafter, we shall refer to these products as the "KQ dielectric," or as simply "KQ." In particular, that Patent describes the construction of an "encapsulated" microstrip transmission line. This Disclosure concerns further novel and useful thick film techniques pertaining to an encapsulated it microstrip transmission line, not heretofore practical, that may be practiced with these KQ dielectric materials. Accordingly, U.S. Pat. No. 6,255,730 B1 is hereby incorporated herein by reference.

BACKGROUND OF THE INVENTION

To begin, then, the reasons for using transmission line structures are many and well known. As higher and higher frequencies are employed it is also increasingly likely that increasing degrees of integration are used to realize the circuitry. It is not, however, the case that this is always accomplished within the confines of a single piece of semiconductor material (that is, within one Integrated Circuit, or IC); it remains the case that the "hybrid" circuit consisting of a substrate with various thick film structures thereon that are interconnected with a plurality of ICs is a desirable technique. So it is that we find high frequency hybrids that include transmission line structures fabricated upon the substrate thereof; it becomes a preferred way of conveying signals from one IC on the hybrid to another. We are particularly interested in the case when the transmission line is of the encapsulated microstrip type described in the incorporated Patent. By the term "encapsulated" that Patent means that the transmission line, which in their example is what would otherwise be called a microstrip, is fully shielded, with a ground completely surrounding the center conductor. It is not exactly what we would ordinarily term a "coaxial" transmission line, since its cross section does not exhibit symmetry about an axis; it has a line and a rectangular trapezoid for a cross section instead of a fat point and surrounding circle. Nevertheless, we shall find it appropriate and convenient to call it (the 'encapsulated' transmission line of the '730 B1 Patent) a 'quasi-coaxial' transmission line, which, it should be noted, is pretty small (perhaps 0.050" wide by 0.010" or 0.015" high, which makes the otherwise diminutive 0.100" diameter RG 174/U seem large in comparison).

Sometimes the signals carried by these quasi-coaxial transmission lines must enter or leave the hybrid substrate, and this almost certainly means that some sort of coaxial connector of the controlled characteristic impedance variety is required.

There are "right angle connectors" that are intended for similar service on printed circuit boards. They are generally easy to mount, and they afford fairly good shielding and good mechanical stability. But maintaining a truly controlled characteristic impedance (say, 50 Ω) at multi-gigahertz operation is not easy, and some right angle connectors can exhibit undesirable discontinuities at certain frequencies. Their "straight through" or "end launch" brethren do much better in this regard, but even they are not, as they come out of their package, a complete solution for attaching to the quasi-coaxial transmission line of a hybrid circuit, as described above and in the incorporated Patent to Dove, Casey and Blume. Part of the difficulty is that any of the standard sizes (say, of the SMA variety) may be of an awkward form factor to attach to such a small transmission line, and the substrate at hand may be significantly thinner than the thinnest standard printed circuit board. This can give rise to difficulties in keeping the characteristic impedance uniform during the transition from the connector to the transmission line. In addition, and this is by itself a significant issue, the straight through connectors offer no facility for maintaining the shielding around the entire center conductor during the actual transition. This lack of shielding allows for much potential mischief, including losses owing to radiation, interference in other nearby circuits caused by that radiation, and coupling of other unwanted signals into the unshielded transition to create interference.

It is not at present economically practical to develop a complete new connect or just to solve these problems. Instead, it is preferable to find a way to employ an otherwise suitable and readily available existing connector. What to do?

SUMMARY OF THE INVENTION

A solution to the problem of connecting a merchant straight through coaxial RF connector to an quasi-coaxial transmission line formed on the substrate of a hybrid is to, if necessary, gradually increase the height of the center conductor of the quasi-coaxial transmission line by increasing the thickness of underlying deposited dielectric until the center conductor of the transmission line matches the position of the center conductor of the connector, which two may then be joined with solder or conductive adhesive. One style of coaxial RF connector of interest has four prongs disposed in a rectangle around the center conductor on the permanent and non-threaded side. Two of the prongs define a long side of a rectangle and may be soldered or otherwise attached to the substrate with conductive adhesive, and the two prongs that define the long side closest to the center conductor can support a small cover that physically bridges and electrically shields the gap between the connector and the end of the quasi-coaxial transmission line. The cover provides complete shielding and assists in minimizing the discontinuity in characteristic impedance caused by the transition between the connector and the quasi-coaxial transmission line.

DESCRIPTION OF A PREFERRED EMBODIMENT

Although there are many different coaxial RF connectors on the market to which the principles of the invention may be applied in making a connection to a quasi-coaxial transmission line formed on a substrate, we shall pick one for use as an example, with the understanding that we could just as easily have picked another, and that minor variations would arise. The connector we have selected for demonstration purposes is the Amphenol 901-10019 SMA Edge Mount Printed Circuit Receptacle (an SMA connector intended for use on the edge of a 0.032" thick PC board). This connector is available from the Amphenol Corporation (tel. 800-627-7100) and its distributors. A complete description of the connector may be found on line at www.amphenolrf.com.

Figure 1:
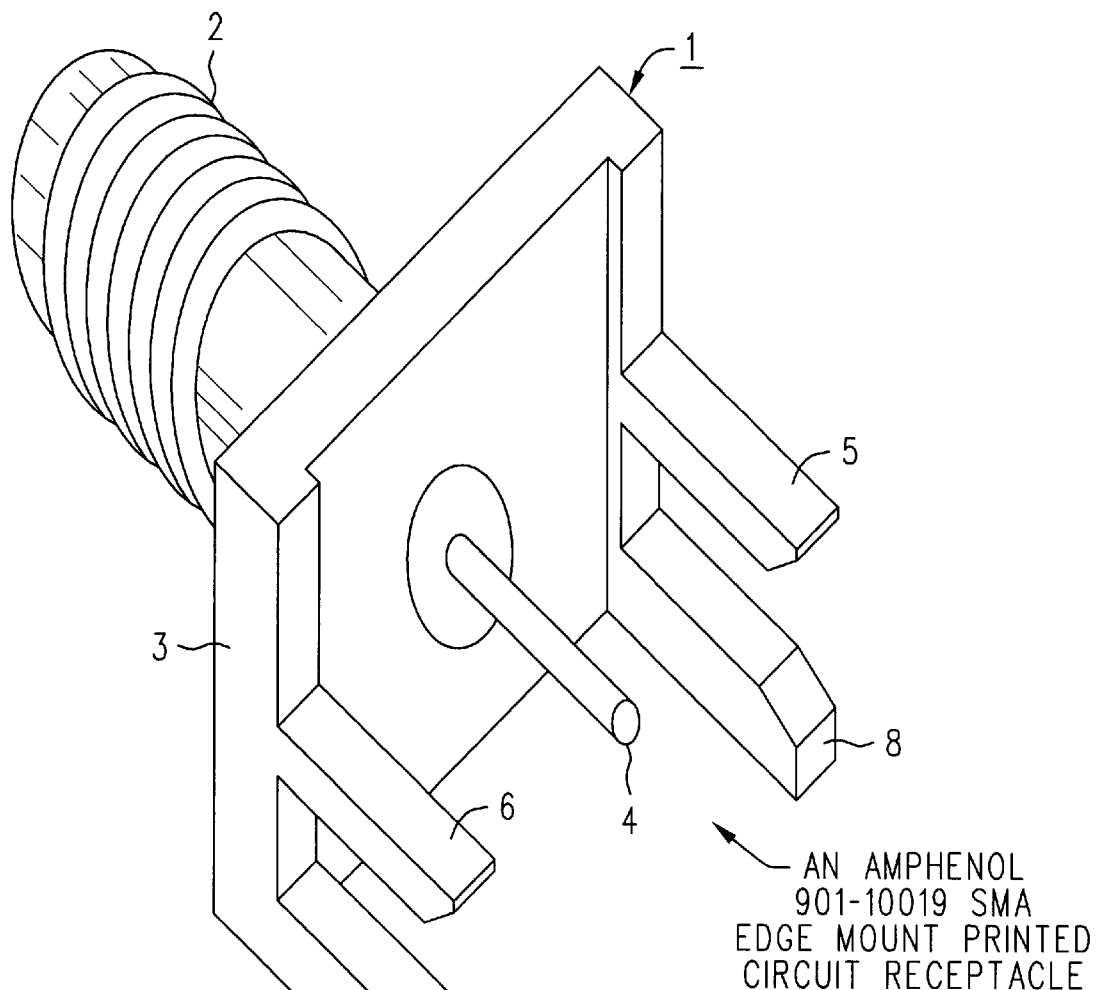
FIG. 1 is an illustration of a conventional edge mount SMA connector that may be used to practice the invention.

Refer now to FIG. 1, wherein is shown a simplified representation of a merchant coaxial RF connector 1 of the edge mount, end launch, SMA variety. A threaded end 2 extends away from a base plate 3 and is formed to receive a corresponding (male) SMA connector (not shown). Of most interest to us are the center conductor 4 and the four mounting prongs 5, 6, 7 and 8, all of which extend in the other direction.

Figure 2:
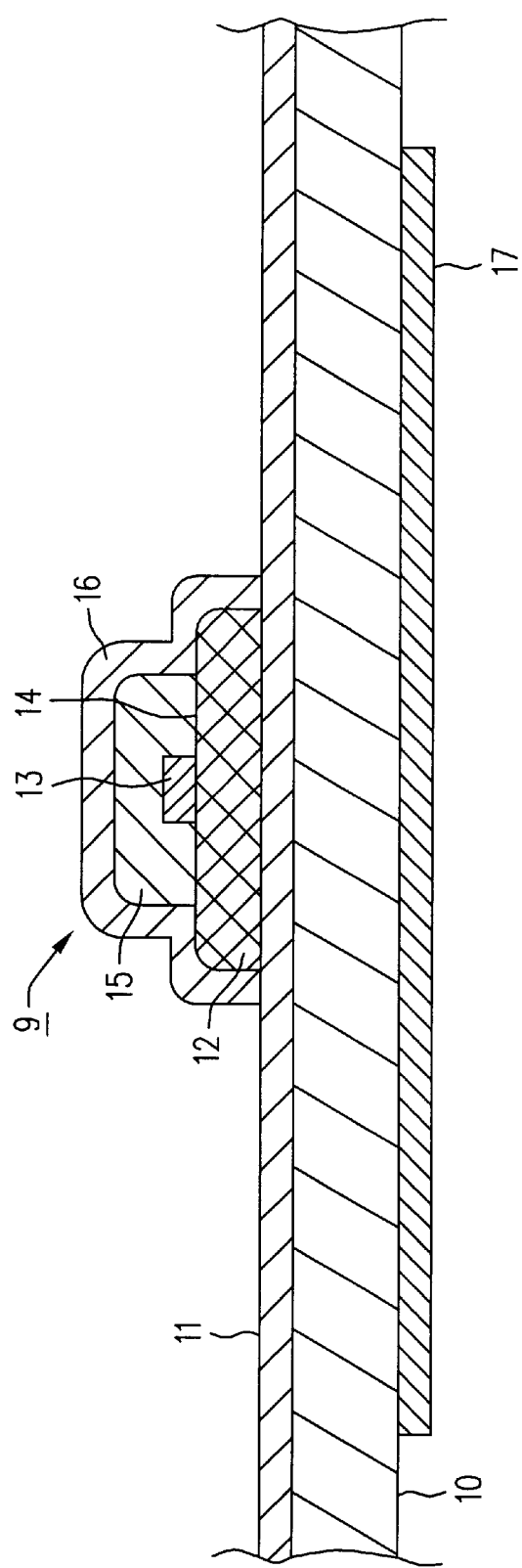
FIG. 2 is a cross sectional view of a thick film quasi-coaxial transmission line on a substrate and to which an RF connector, such as the one of FIG. 1, is to be attached.

Refer now to FIG. 2, wherein is shown a cross sectional view of a quasi-coaxial transmission line 9 fabricated upon a substrate 10 with thick film techniques as taught in the incorporated '730 B1 Patent. In particular, note the ground plane 11, deposited on the "top" of the substrate 10 (i.e., on the same side as the transmission line 9), and which, as ground planes do, may extend liberally in all directions as needed. The ground plane may be of metal, preferably gold, and if patterns therein are needed, an etchable thick film Au process, such as the Heraeus KQ-500 may be used. The quasi-coaxial transmission line itself includes a layer or strip 12 of KQ dielectric material, that meanders as needed for the desired path of the transmission line. Once that is in place, a suitable layer or strip of metal 13 (which is preferably Au) is deposited on the top surface 14 of the strip 12. This strip of metal 13 is the center conductor of the quasi-coaxial transmission line (and is what needs to be connected to the center conductor 4 of the connector 1 of FIG. 1). Subsequently, a second layer or covering strip of KQ dielectric 15 is deposited onto top surface 14, enclosing the center conductor 13. Finally, an enclosing layer of metal 16 (preferably Au) is deposited over the combined KQ strips 12 and 14, with the result that the center conductor 13 is completely surrounded by ground, and thus becomes a quasi-coaxial transmission line. The characteristic impedance of the quasi-coaxial transmission line 9 is determined in a known manner by the dielectric constant of the KQ material and the dimensions of the KQ strips or layers 12 and 15. Thus, the quasi-coaxial transmission line 9 may be fabricated to have a particular characteristic impedance, such as 50 Ω, or perhaps 75 Ω, as desired. The task ahead is to suitably connect the quasi-coaxial transmission line 9 to an appropriate connector, such as the SMA connector 1 of FIG. 1.

Before proceeding, however, a brief note is in order concerning the ground plane 11. As a true ground plane it will perform best if it is indeed a broad sheet of metal, and that is what the figure shows. On the other hand, the portions of such a ground plane not beneath the quasi-coaxial transmission line do not afford any particular benefit to the transmission line, insofar as it is a transmission line considered in isolation. The situation may become more complex if there are other circuits located to one side of the transmission line that require strong RF currents to be carried in a ground plane; good practice would be to keep such currents out of the shield for the transmission line. In any event, it may be desirable to not have an entire plane of metal serving as ground. In an extreme such case only the path of the transmission line needs to have a sufficiently wide ground put down before the quasi-coaxial transmission line is fabricated on top thereof. However, that path for ground should have at the edge of the substrate a yet wider area or pad of sufficient size to receive the mounting prongs 5 and 6 of the connector 1, and better still, large enough to accommodate the "footprint" of the cover/shield 22 (please refer ahead briefly to FIG. 3). This is most desirable to ensure a "solid" grounding of the RF connector 1 and the soon-to-be-introduced cover/shield 22.

The layer 17 on the bottom of the substrate 10 is an optional layer of metal. Layer 17 may or may not have its own separate connection to ground, or even attempt to otherwise be part of a ground plane a system. That is, it may just be an isolated region of metal, if it is present at all. We show it as an optional potential location for soldering mounting prongs 7 and 8 of the connector 1. (Which, it turns out, if it were done would itself ground region 17. And although that might not provide a really good RF ground at higher microwave frequencies, it does no harm.)

Figure 3:
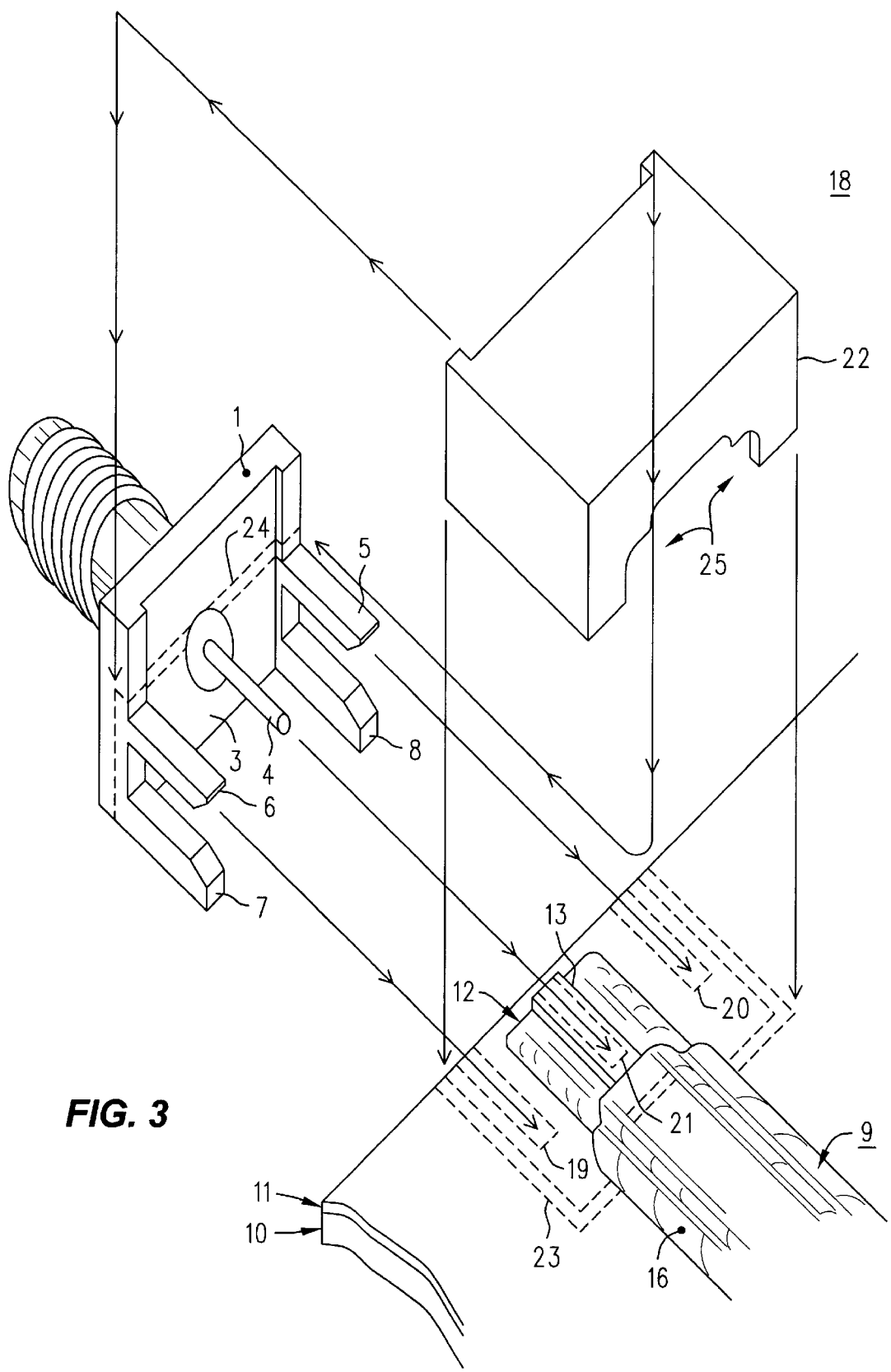
FIG. 3 is an illustration of how the connector of FIG. 1 is attached to the quasi-coaxial transmission line of FIG. 2, including the use of a cover to fully shield the connection.

Refer now to FIG. 3, which is an exploded view of a preferred arrangement 18 for mounting the RF connector 1 of FIG. 1 onto the end of a quasi-coaxial transmission line 9 fabricated on a ceramic Q substrate that may be, say, of 96% alumina and 0.040" thick. As can be seen in the figure, the quasi-coaxial transmission line 9 approaches the edge of the substrate, and (at least the center conductor portion 13) stops just short of the edge to avoid an unintentional connection between the center conductor 13 and the back side of the connector base plate 3. In addition, it will be noted that the center conductor 13 is exposed on top of KQ layer 12 by an absence of the outer layer of metal 16 for a distance from the end that is somewhat more than the length that the center conductor 4 of the RF connector extends away from the base plate 3. These arrangements provide clearance for the bottoms of mounting prongs 5 and 5 of connector 1 to be placed onto the ground plane 11 in the positions indicated by dotted lines 20 and 19, respectively. They may be soldered or attached with conductive adhesive. The connector straddles the quasi-coaxial transmission line 9 placing its center conductor 4 directly over, and preferably against, the center conductor 13 of the transmission line 9, in the location indicated by dotted line 21. Preferably, it is possible to arrange that "against" obtains by controlling the thickness of layer 12 in the vicinity of the transition to the RF connector 1, and that this does not introduce undue disturbance to the characteristic impedance at that location in the transmission line. If needed, a slight downward bend in the center conductor 4 might be introduced to achieve the close mechanical proximity needed for electrical connection. In any event, such electrical connection between the two center conductors 4 and 13 is secured through either soldering or a suitable conductive adhesive.

The top sides of mounting prongs 7 and 8 may come into contact with the bottom of the substrate 10. If they do, then it may be desirable for the optional metal layer 17 to be present, so that those prongs can be soldered there to provide additional mechanical support. If the prongs 7 and 8 don't touch the bottom of the substrate 10, they it may be desirable to simply embed them in a dab of adhesive (e.g., epoxy) to assist with mechanical support. On the other hand, it is also possible to dispense with any mechanical connection between prongs 7 and 8 and the bottom of the substrate 10.

At this point the RF connector is attached, but there is an unshielded portion of center conductor (all of 4, perhaps just a bit of 13) that can couple unwanted signals. To stop that we install conductive N cover or shield 22, preferably of metal, say, brass. There are many shapes this cover or shield could have, influenced by the nature of the RF connector and the details of the substrate 10 and transmission line 9. It will be appreciated that we have shown a representative shape, and that even for the particular Amphenol SMA connector 1 depicted, the shield/cover 22 could have other shapes. Likewise, there are lots of fabrication techniques for making the thing: stamped, folded, molded, cast, machined, etc. Likewise, it might be silver or gold plated for enhance surface conductivity. Instead, it is important that it fits over the exposed center conductors without touching them and snugly engages the surrounding grounds on the base plate 3 of the connector and 11 on the top of the substrate, as indicated by dotted lines 24 and 23, respectively. To this end, cover/shield 22 includes a cut-out region 25 to allow it to fit snugly over, and be connected to, the ground layer 16 over the top of quasi-coaxial transmission line 9. The cover/shield 22 is secured in place by solder or conductive adhesive applied in the regions of the dotted lines 23 and 24, including where it touches the ground layer 16 at the top of the quasi-coaxial transmission line 9.

Figure 4:
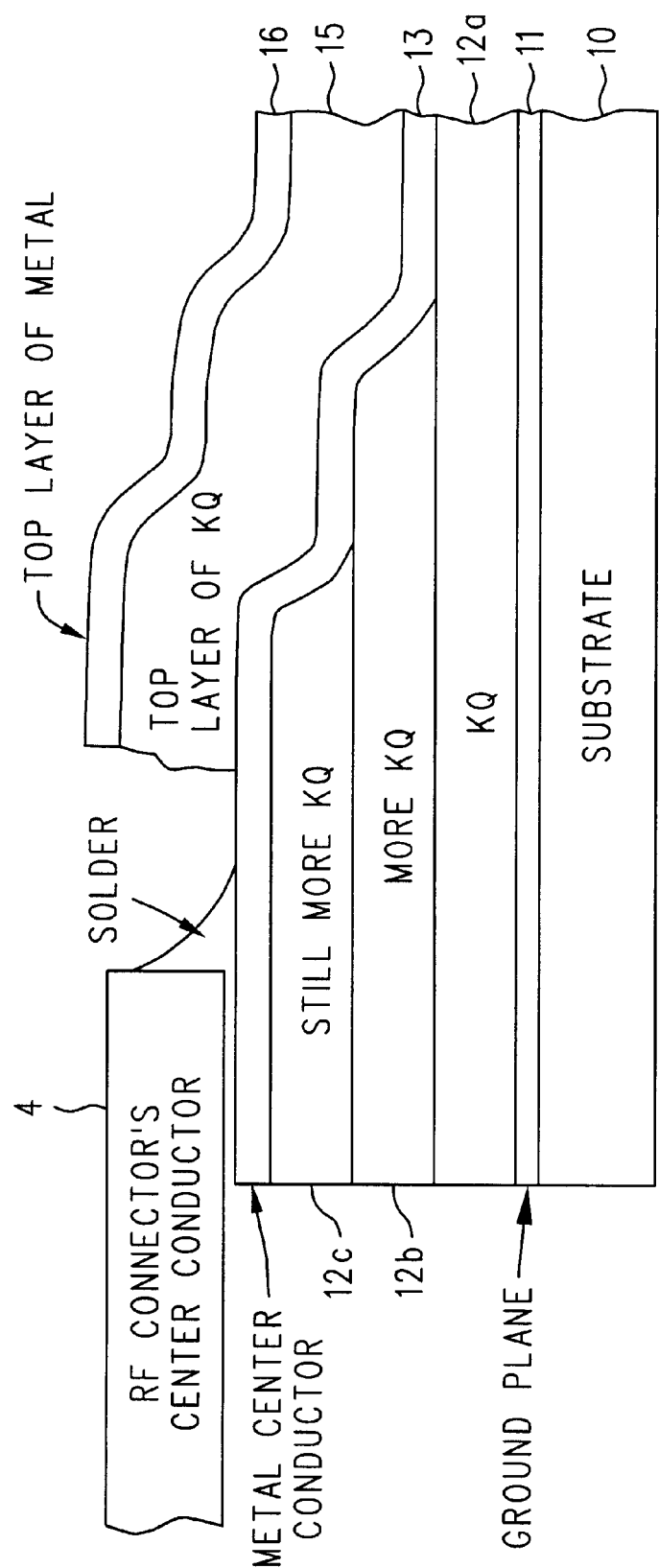
FIG. 4 is a simplified side view of a situation like that of FIG. 3, but where the center conductor of the transmission line has increased height above the substrate.

To conclude, we briefly discuss certain alternatives. Suppose the standard RF connector to be employed has a center conductor height that is too far above that of the quasi-coaxial transmission line. The simplest solution is to find a way to reposition the connector so that the heights do match. Next, one might shave the mounting prongs to get a suitable match. On the other hand, and with reference to FIG. 4, it will be appreciated how the height of the center conductor 13 above the substrate 10 can be increased, if needed to better match the connector's center conductor. This may done by including short sections of additional KQ dielectric beneath the center conductor 13. To be sure, this may alter the characteristic impedance of the transmission line where that is done, unless some other change compensates it. Such compensation can be accomplished, for example, by correspondingly varying the width the center conductor 13 as its height above the ground plane changes.

The cover/shield 22 can also assist in minimizing unwanted changes in characteristic impedance at the transition from. the quasi-coaxial transmission line 9 to the RF connector 1. To do this most effectively, one can vary how high the inside surface of the cover/shield 22 is above the center m conductors, and perhaps also variously sculpt its interior shape to track the change in shape of the center conductors as they join each other.

It is envisioned that the techniques described herein can be operable to perhaps 40 GHz, or beyond. At these vary high frequencies close attention must be paid to physical relationships, as they are indeed very significant electrically. So, for example, mindful that a simple solder joint of a fat round center conductor 4 onto a small skinny center conductor 13 could be uncomfortably inductive, it may be desirable to flatten the round center conductor 4 into more of a thin ribbon and attach that to the center conductor 13. A companion change in width of the quasi-coaxial transmission lines center conductor and/or it height above the ground plane might accompany this. Furthermore, at frequencies of 40 GHz and above the venerable SMA connector may be unsuitable, and it may be desirable to adapt the techniques described herein for use with APC 3.5 connector or the 2.4 mm series connectors.

We claim:

1. Apparatus comprising:

a substrate;

a quasi-coaxial transmission line fabricated on the substrate and approaching an edge thereof, an endmost portion of the quasi-coaxial transmission line having a center conductor that is exposed through the absence of endmost portions of an enclosing layer of dielectric material and an enclosing layer of metal, the enclosing layer of dielectric material and enclosing layer of metal being furthest away from the surface of the substrate that the quasi-coaxial transmission line is fabricated upon, with the center conductor of the quasi-coaxial transmission line being between the surface of the substrate and where those endmost portions of the enclosing layers would be were they not absent;

a region of metal ground upon the substrate on the same side thereof as the quasi-coaxial transmission line and located proximate the edge where the quasi-coaxial transmission line approaches the edge of the substrate, the region of metal ground being contiguous with and electrically connected to a layer of metal on the substrate that forms the grounded shield of the quasi-coaxial transmission line;

a coaxial connector having a body and a center conductor, the body mechanically and electrically connected to the region of metal ground proximate the edge, and the coaxial connector having its center conductor electrically connected to the exposed center conductor of the quasi-coaxial transmission line; and a conductive cover disposed over the connection between the coaxial connector and the exposed center conductor of the quasi-coaxial transmission line, the conductive cover fitting mechanically close to and being individually electrically connected to the body of the coaxial connector, to the region of metal ground proximate the edge, and to the enclosing layer of metal of the quasi-coaxial transmission line.

2. Apparatus as in claim 1 wherein the coaxial connector is an edge mount, end launch connector.

3. Apparatus as in claim 2 wherein the coaxial connector is an SMA connector.

4. Apparatus as in claim 1 wherein the quasi-coaxial transmission line is fabricated from KQ dielectric materials from Heraeus Cermalloy.

* * * * *